Figure 3:
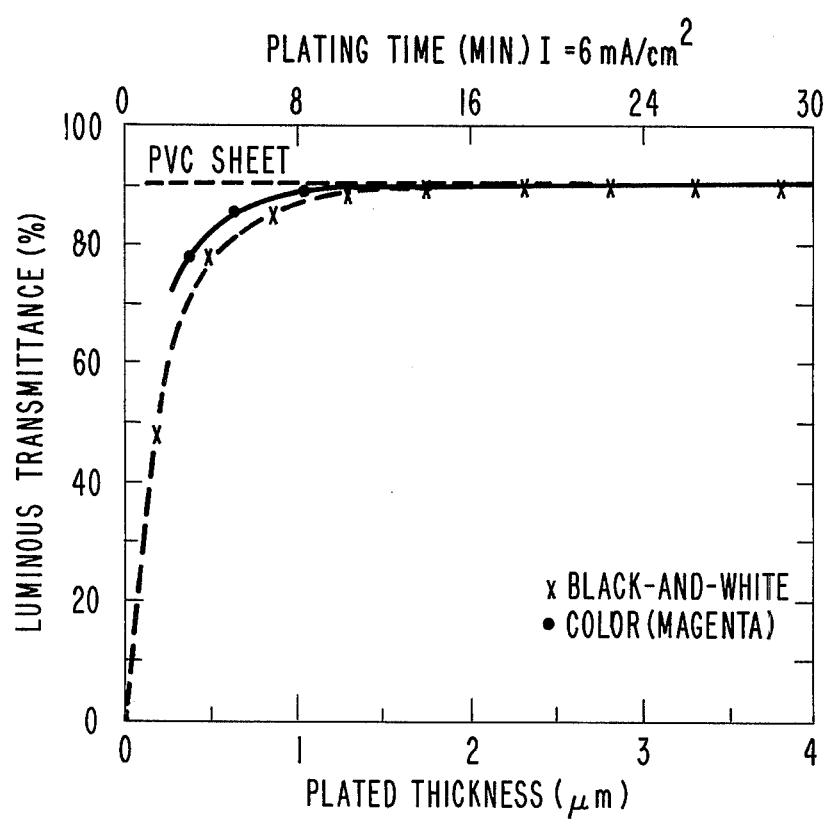

United States Patent [19]

Gale et al.

[11] 4,108,660

[45] Aug. 22, 1978

[54] FABRICATION OF DIFFRACTIVE SUBTRACTIVE FILTER EMBOSSING MASTER

[75] Inventors: Michael Thomas Gale, Wettswil; James Kane, Zumikon, both of Switzerland

[73] Assignee: RCA Corporation, New York, N.Y.

[21] Appl. No.: 781,304

[22] Filed: Mar. 25, 1977

[30] Foreign Application Priority Data

Apr. 7, 1976 [GB] United Kingdom ............... 14163/76

[51] Int. Cl.² .................................................. G03C 5/00
[52] U.S. Cl. ......................................... 96/38.2; 96/36; 96/38.3
[58] Field of Search .................. 96/36, 38.2, 38.3, 38, 96/67, 81; 350/3.5

[56] References Cited

U.S. PATENT DOCUMENTS

| | | | |
|---|---|---|---|
| 3,669,673 | 6/1972 | Ih | 350/3.5 X |
| 3,832,176 | 8/1974 | Verstraete et al. | 96/36 X |
| 3,894,179 | 7/1975 | Jacobs et al. | 96/36 X |

*Primary Examiner*—Edward C. Kimlin
*Assistant Examiner*—Alfonso T. Suro Pico
*Attorney, Agent, or Firm*—H. Christoffersen; Samuel Cohen; George J. Seligsohn

[57] ABSTRACT

A recording blank, composed of at least one diffraction grating substrate, such as nickel, covered with a layer of photoresist is used to produce an embossing master by exposing the photoresist to picture information composed of respective white and non-white manifesting regions; developing the exposed photoresist to reveal the grating portions underlying solely the white manifesting regions; electroplating and/or etching the revealed portions to level and obliterate the revealed grating portions, and then removing the remainder of the photoresist.

6 Claims, 3 Drawing Figures

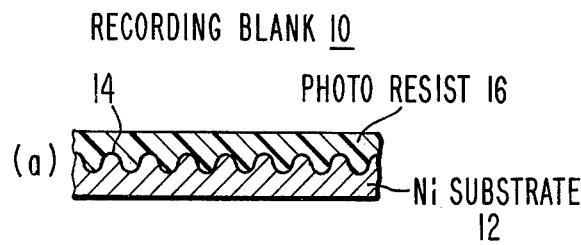
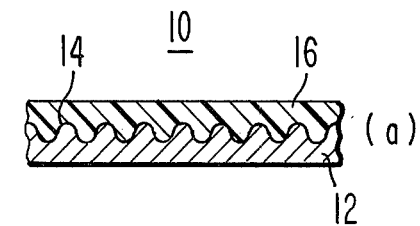
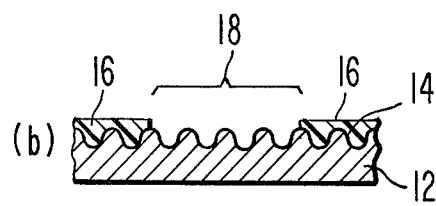
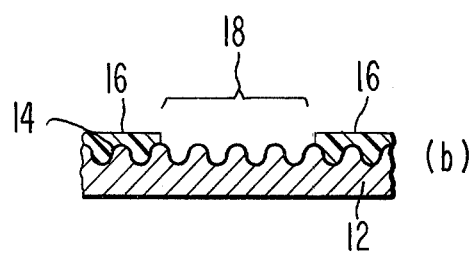
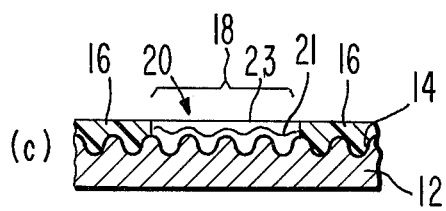
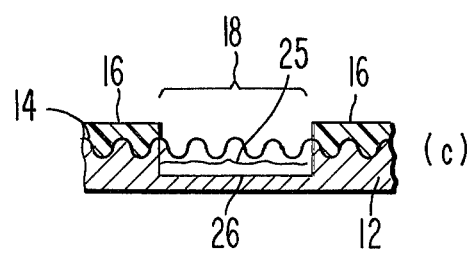
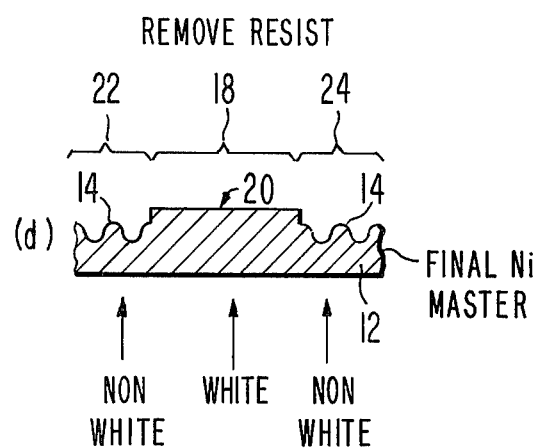
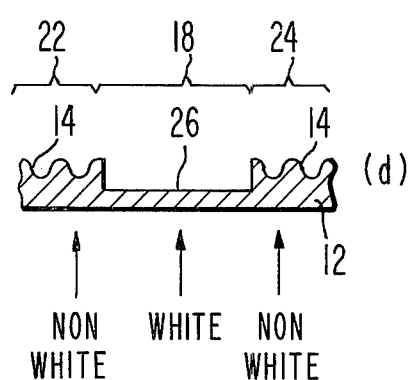
Fig. 1.
Fig. 2.

FABRICATION OF DIFFRACTIVE SUBTRACTIVE FILTER EMBOSSING MASTER

This invention relates to a method for fabricating a master to be used in hot embossing into a thermoplastic film a diffractive filter.

Reference is made to U.S. Pat. No. 3,957,354, issued May 18, 1976 to Knop, and co-pending U.S. patent application Ser. No. 671,105, filed Mar. 29, 1976 by Gale, now U.S. Pat. No. 4,062,628, both of which are assigned to the same assignee as the present invention. The patent relates to a diffractive subtractive color filtering technique, while the application relates to a black-and-white diffractive subtractive filter. As is disclosed in these references, a diffractive subtractive filter may comprise a relief pattern embossed in the surface of a thermoplastic film. In the case of a color filter, the relief pattern preferably comprises a step function waveform profile, such as a square-wave grating of a predetermined amplitude. In the case of a black-and-white filter, the relief pattern preferably comprises a profile formed by two crossed sinusoidal waveforms of respective predetermined amplitudes. Both color and black-and-white filters may contain picture information in the relief pattern in the form of regions containing the waveform profile and regions devoid of it.

In general, the replication of relief-pattern diffractive structures by embossing under pressure from a master is known in the art. The master itself is normally fabricated by the following conventional technique:

First, a layer of photoresist, coated onto a substrate, is exposed one or more times to grating and picture-image manifesting light, where the term picture is understood to include pictorial, line drawing and text information. The photoresist layer may be developed after each exposure thereof or, alternatively, the photoresist layer may be developed only once after multiple exposures thereof. In any case, after complete exposure and development of the photoresist layer, the desired relief pattern is defined by the surface of the photoresist layer. The relief pattern normally comprises regions of a diffractive structure having effective line-spacing and depth dimensions in the order of only a few micrometers or less, and level regions devoid of this structure. This relief pattern is normally transferred to a metal master by first covering the relief pattern on the photoresist layer with a microscopically thin coating of metal, for example, by electroless plating, evaporation or sputtering, and thereafter electroplating a given metal, such as nickel, to provide a metal-foil master of sufficient thickness. Finally, the finished metal master must be stripped from the original photoresist layer and any remaining photoresist must be dissolved from the metal master.

This conventional technique for fabricating a master requires relatively sophisticated instrumentation, and highly skilled personnel, and is relatively time consuming. For instance, it typically takes 1½ to 2 hours to nickel plate a 0.1mm thick master.

Reference is made to U.S. Pat. No. 3,743,507, issued July 3, 1973, which is directed to a recording blank for recording a relief-pattern diffractive structure, such as a synthetic focused-image hologram. Such a recording blank comprises a substrate having a surface formed of a set of spaced line ridges defining a diffraction grating of a given profile and depth, together with a photoresist disposed on this surface of the substrate. The photoresist fills all the respective spaces between adjacent line ridges and provides a substantially smooth exterior surface.

In accordance with the principles of the present invention, such a recording blank may be employed in a method for fabricating a master to be used in hot embossing into a thermoplastic film a diffractive subtractive filter representing certain picture-image information defined by a spatial arrangement of contiguous white-manifesting regions and non-white manifesting regions. The method comprises exposing the photoresist to light manifesting the certain picture information and then removing the exposed photoresist from solely the white-manifesting regions to reveal the spaced line ridges of only those portions of the surface of the substrate underlying the white-manifesting regions. After this, solely the revealed portions of the surface of the substrate are leveled to obliterate the space line ridges of the white-manifesting regions. Finally, the remaining photoresist is removed to now reveal the spaced line ridges underlying the non-white manifesting regions of the exposed photoresist.

IN THE DRAWINGS:

FIG. 1 illustrates a first embodiment of the present invention utilizing a recording blank comprising a nickel substrate, in which leveling of the revealed positions of the surface of the substrate to obliterate the spaced line ridges is accomplished by electroplating these revealed portions with additional nickel, FIG. 2 illustrates a second embodiment of the present invention utilizing a recording blank comprising a nickel substrate, in which leveling of the revealed portions of the surface of the substrate to obliterate the spaced line ridges is accomplished by etching these revealed portions, and FIG. 3 shows respective plots of transmittance as a function of plating thickness for both black-and-white color diffractive substractive filters.

The present invention makes it possible to separate the manufacture of standard recording blanks, containing no picture information, from the fabrication of a master containing picture information. This permits the production of a master from a standard recording blank by a fabricator. The master may be used by the fabricator to hot emboss into a thermoplastic film a diffractive subtractive filter representing picture information, such as a microfiche. Thus, the need for relatively sophisticated instrumentation and techniques is restricted to the manufacturer of the standard recording blanks, and is not required by the fabricator. This is analogous to the situation in photography, where standard types of unexposed, undeveloped film are manufactured only by sophisticated manufacturers, while unsophisticated users of the film may expose the film to picture-information manifesting light, develop the exposed film and then utilize the resulting product for such purposes as microfiche.

The following table lists a sequence of steps suitable for the manufacture of nickel substrate recording blanks (such as element 10 of FIGS. 1 and 2 described below). The individual steps are well known in the art and are quite similar to those described in the aforesaid U.S. Pat. No. 3,743,507:

1. High-quality original standard gratings in nickel are produced and kept at a factory
2. Large numbers of substrate blanks are produced from the standard grating in the following way:

(a) The original gratings are replicated into plastic (PVC) tape.

(b) A thin electroless nickel layer is deposited onto the surface of the tape containing the grating pattern.

(c) Thick nickel foil is electroplated onto the exposed surface of the nickel layer.

(d) The plastic (PVC) is removed, leaving nickel substrate blanks in tape form.

3. The substrate blanks are coated with photoresist to provide finished recording blanks to be used by a fabricator.

The high-quality original standard gratings preferably include two superimposed crossed sinusoidal gratings, each having its own respective specified depth, which may be fabricated in the manner described in the aforesaid application Ser. No. 671,105, now U.S. Pat. No. 4,062,628. The high-quality original standard gratings further preferably include three separate square-wave gratings, each having a depth corresponding to a different subtractive primary color, as disclosed in the aforesaid U.S. Pat. No. 3,957,354. Employing steps 2a–2d, inclusive, the manufacturer can produce large numbers of copies of the relatively expensive original gratings in nickel. The resulting nickel substrate blanks are thus physically identical to the original gratings in nickel, but have a significantly lower manufacturing cost.

The completed nickel substrate recording blanks (consisting of the nickel substrate blanks coated with photoresist) are suitably wrapped (similar to unexposed photographic film) to prevent premature exposure. They are then forwarded to the user thereof, such as a fabricator who wishes to produce a diffractive-subtractive-filter microfiche.

In the following discussion, it is assumed the photoresist on the recording blank is a positive photoresist, (which is usually the case). Referring now to FIG. 1, at (a) recording blank 10, is composed of nickel substrate 12 having a surface 14 thereof covered with photoresist layer 16. Surface 14 comprises at least one set of spaced line ridges defining a diffraction grating of a given profile (such as a sinusoid or square-wave) and a given depth. This structure, shown at a, corresponds to an unexposed film.

The user, when he wishes, to "take a picture" exposes photoresist 16 to picture information which usually comprises a pattern of contiguous white-manifesting regions and non-white manifesting regions. Assuming photoresist 16 to be a positive photoresist, white-manifesting regions comprise those which are illuminated by light, while non-white manifesting regions are those not illuminated by light. In practice, the picture information is obtained by either contact printing or projection of a transparency. The transparency picture information may already intrinsically include screening to provide a half-tone gray scale. Alternatively, if the transparency information does not include intrinsic screening, an extrinsic screen may be utilized together with the transparency to provide a half-tone gray scale after resist development. In either case, the size of each screening aperture is large relative to the spacing of the diffraction grating line ridges, but small relative to the smallest resolvable picture element of the picture-image information. In the case of the fabrication of a black-and-white diffractive subtractive structure, the transparency is a black-and-white positive of the picture information. However, the fabrication of a color diffractive subtractive filter requires that the transparency be a color-separation corresponding to that one of the subtractive primary colors (magenta, cyan or yellow) which itself corresponds with the depth of the color diffractive subtractive filter to be embossed by the master fabricated from the recording blank.

As indicated at (b) in FIG. 1, development of exposed positive photoresist 16 results in the removal of exposed positive photoresist 16 from solely the white-manifesting regions, such as region 18, which have been illuminated during exposure. This removal of photoresist 16 reveals the spaced line ridges of only those portions of diffraction grating surface 14 of substrate 12 underlying these white-manifesting regions, such as region 18.

The next step shown at (c) in FIG. 1 is to electroplate solely the revealed white-manifesting regions, such as region 18, of nickel substrate 12 with additional nickel 20. Sufficient nickel is employed to flatten solely the revealed portions of the surface of nickel substrate 12 to obliterate the space line ridges of the white-manifesting regions, such as 18 of grating 14. The wavy line 21 shows the nickel surface in region 18 at an intermediate point in the plating process and the straight line 23 indicates the final level profile. The non-white manifesting regions will not plate-up in an electroplating bath since they are masked by photoresist layer 16 and are thus electrically insulating.

The nickel master which results after the final step in the process is shown at (d) of FIG. 1. The final step comprises removing the remaining photoresist to now reveal the spaced line ridges of diffraction grating 14 underlying the non-white manifesting regions, such as regions 22 and 24, of the exposed photoresist 16. The region 18 of the final nickel master is somewhat raised (perhaps 2–4μm) with respect to the non-white manifesting regions 22 and 24 of the final nickel master. The peak-to-peak amplitude (depth) of any diffraction grating of surface 14 is very small (1–2μm), and only a 2–4μm layer 20 of plated nickel is required to provide a smooth, level electroplated surface. The surface of the nickel layer 20 should ideally be optically smooth. The smoother the surface, the higher the quality of the "white" in the final embossed image. Roughness of the surface results in the scattering of incident light and deteriorates the quality of the white.

Although in principle, substrate 12 and the electroplated coating may be almost any metal, it has been found that a thin nickel electroplated coating adheres exceptionally to a nickel substrate and provides smooth, bright (i.e. non-scattering) level deposits.

Anyone of a number of standard electroplating methods may be used to perform the electroplating described above. One example, is the sulfamate plating method. Another method employs a "double salt" (e.g. containing 120 gm/l nickel sulfate, 15 gm/l ammonium chloride, 15 gm/l boric acid and a wetting agent). Another method is a Watt's bright nickel bath.

FIG. 3 shows the luminous transmittance of color and black-and-white diffractive-subtractive-filter replicas as a funtion of the plated thickness. A maximum transmittance close to that of the original PVC sheet is obtained after plating about 1.5μm of nickel, and is maintained for a further 2–3μm. The exact plating thickness is thus not critical, an important feature for practical applications. The plating time for a current density of 6 mA/cm² is about 12 minutes. Since lateral spread of the plated areas is prevented by the walls of the 1.5μm thick photoresist film, the full resolution of the photoresist pattern is retained. This is only by way of example. In general, a sufficiently smooth electroplated surface may be obtained with only 5-10 minutes of electroplating.

As shown in the embodiment of FIG. 2, flattening of the revealed portions of the surface of the substrate to obliterate the spaced line ridges also may be achieved by etching the substrate material, rather than by electroplating additional material onto the surface. More specifically, steps (a) and (b) of the embodiment shown in FIG. 2 are identical with steps (a) and (b) of the embodiment shown in FIG. 1, described above. However, as indicated by step (c) of FIG. 2, the line ridges of surface 14 of solely the revealed portions, such as portion 18, are removed by etching them away. Wavy line 25 indicates schematically the shape of the surface at an intermediate time in the etching process and line 26 indicates the final level and smooth surface obtained when the etching step is terminated. The step removing the remaining photoresist of the embodiment of FIG. 2 is identical to the corresponding step in the embodiment of FIG. 1 and the final product obtained upon the completion of this step is shown at (d) in FIG. 2.

The etching of the revealed portions of the surface of substrate 12, such as region 18 may be accomplished by chemical etching, electrolytic etching or a combination of both chemical and electrolytic etching. Because of the high degree of required smoothness, typical nickel chemical etchants cannot be used. Instead, it is necessary to use a "polishing" chemical etchant to obtain the required fine-grain surface. By way of example, either of the two following known formulations for "polishing" chemical etchants may be used:

(1) 90 ml $H_3PO_4$ 85%
    10 ml $HNO_3$
(2) 60 ml $H_2SO_4$
    30 ml $HNO_3$
    4 ml HCL
    2 ml $H_2O$

The etching step should be accurately controlled, since with too little etching the relief diffractive structure is not sufficiently leveled, while with too much etching the surface granularity becomes excessive. For grating periods having depths of 1-2$\mu$m, an etch depth of 3-4$\mu$m is optimum using the above etchants.

A variation in the etching technique of FIG. 2 involves using a metal master composed of a thin layer of metal A (e.g. approximately 3$\mu$m of C$\mu$) on a thicker base of metal substrate B (e.g. Ni). A selective etchant for metal A is then used such that the A-B interface forms a barrier to the etching. The etching tolerances are considerably relaxed and the smoothness of the resulting surface is determined by that of the base metal B, which can be made extremely high.

As an alternative to the chemical etching described above, the revealed portions also may be etched electrolytically (the inverse of the electroplating). Since electrolytic etching inherently is capable of providing improved smoothness of the etched surface over that obtainable chemically, electrolytic etching may be substituted for chemical etching or, alternatively, it may be used as a second etching step after chemical etching, to provide "electropolishing". However, one advantage of chemical etching, over electrolytic etching, is that it may be employed on non-conducting substrates if that is desired.

Just as electroplating, in FIG. 1, produces a slightly raised surface 20 with respect to diffraction grating surface 14, etching, in FIG. 2, produces a slightly depressed surface 26 with respect to diffraction grating surface 14. However, the electroplating and etching embodiments of FIG. 1 and FIG. 2 may be combined to flatten the white-manifesting revealed portions, such as portion 18, of the surface of substrate 12 without either raising the leveled surface or depressing the leveled surface with respect to diffraction grating surface 14. More specifically this may be accomplished by alternately electroplating the revealed portions, such as portion 18, electrolytically etching these revealed portions, such as portion 18, (or vice versa), during each of one or more pairs of successive intervals. By making the net amount of material added to the substrate during electroplating intervals substantially equal to the net amount of material removed from the substrate during electrolytic etching intervals, a smooth flat surface (similar to surface 20 or 26) is obtained. However, in this case the flat surface is neither raised nor depressed with respect to the original grating surface 14.

What is claimed is:

1. A method employing a recording blank for fabricating a master to be used in embossing a diffractive subtractive filter, representing certain picture-image information defined by a spatial arrangement of contiguous white-manifesting regions and non-white manifesting regions, into a thermoplastic film, said recording blank comprising a substrate having a given surface thereof formed of at least one set of spaced line ridges defining a diffraction grating of a given profile and depth, said given surface having a photoresist disposed thereon which fills the spaces between adjacent line ridges and provides a substantially smooth exterior surface; said method comprising the steps of:
   (a) exposing said photoresist to light manifesting said certain picture-image information;
   (b) removing all of said exposed photoresist from solely said white-manifesting regions thereby to reveal entirely the spaced line ridges of only those portions of said surface of said substrate underlying said white-manifesting regions;
   (c) leveling solely said revealed portions of said surface of said substrate to obliterate the spaced line ridges of said white-manifesting regions, and
   (d) then removing all of the remaining photoresist to now reveal entirely the spaced line ridges underlying the non-white manifesting regions of said exposed photoresist.

2. The method defined in claim 1, wherein said substrate surface is composed of a metal, and wherein step (c) comprises the step of electroplating a metal onto said revealed portions of said substrate surface.

3. The method defined in claim 1,
   wherein step (c) comprises the step of chemically etching only said revealed portions of said substrate surface.

4. The method defined in claim 1, wherein said substrate surface is composed of a metal, and
   wherein step (c) comprises the step of electrolytically etching only said revealed portions of substrate surface.

5. The method defined in claim 1, wherein said substrate surface is composed of a metal, and
   wherein step (c) comprises the respective steps of alternately electroplating a metal onto said revealed portions of said substrate surface and electrolytically etching said revealed portions of said substrate.

6. The method defined in claim 5,
   wherein said step of electroplating adds an amount of metal to said revealed portions of said substrate surface substantially equal to the amount of metal subtracted by said step of electrolytically etching.

* * * * *